(12) United States Patent
Shen et al.

(10) Patent No.: US 9,899,523 B2
(45) Date of Patent: Feb. 20, 2018

(54) SEMICONDUCTOR STRUCTURE

(71) Applicant: UNITED MICROELECTRONICS CORP., Hsin-Chu (TW)

(72) Inventors: Wen-Jiun Shen, Yunlin County (TW); Chia-Jong Liu, Ping-Tung County (TW); Chung-Fu Chang, Tainan (TW); Yen-Liang Wu, Taipei (TW); Man-Ling Lu, Taoyuan County (TW); Yi-Wei Chen, Taichung (TW); Jhen-Cyuan Li, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/594,159

(22) Filed: Jan. 11, 2015

(65) Prior Publication Data

US 2016/0163797 A1    Jun. 9, 2016

(30) Foreign Application Priority Data

Dec. 3, 2014    (TW) .............................. 103142049 A

(51) Int. Cl.
*H01L 29/78*    (2006.01)
*H01L 29/66*    (2006.01)

(52) U.S. Cl.
CPC ...... *H01L 29/785* (2013.01); *H01L 29/66795* (2013.01); *H01L 29/7843* (2013.01); *H01L 29/7847* (2013.01)

(58) Field of Classification Search
CPC ............. H01L 27/0924; H01L 29/1054; H01L 29/785
See application file for complete search history.

(56) References Cited

U.S. PATENT DOCUMENTS

| | | | |
|---|---|---|---|
| 7,772,074 B2 | 8/2010 | Ye | |
| 7,838,887 B2 | 11/2010 | Woon | |
| 8,193,049 B2 | 6/2012 | Golonzka | |
| 8,629,046 B2 | 1/2014 | Tsai | |
| 2008/0006818 A1 | 1/2008 | Luo | |
| 2009/0212368 A1* | 8/2009 | Yang | H01L 21/823412 257/368 |
| 2010/0038685 A1 | 2/2010 | Weber | |
| 2010/0136761 A1 | 6/2010 | Han | |
| 2012/0061736 A1* | 3/2012 | Yin | H01L 21/26506 257/288 |
| 2013/0069172 A1 | 3/2013 | Liao | |
| 2013/0099294 A1* | 4/2013 | Lu | H01L 21/76232 257/288 |
| 2013/0099314 A1* | 4/2013 | Lu | H01L 21/26506 257/347 |
| 2013/0146895 A1 | 6/2013 | Tsai | |
| 2013/0146949 A1 | 6/2013 | Tsai | |
| 2013/0178029 A1 | 7/2013 | Wang | |
| 2013/0187221 A1 | 7/2013 | Lu | |

(Continued)

*Primary Examiner* — Julia Slutsker
(74) *Attorney, Agent, or Firm* — Winston Hsu

(57) ABSTRACT

The present invention provides a semiconductor structure, comprising a substrate, a gate structure, a source/drain region and at least a dislocation. The gate structure is disposed on the substrate. The source/drain region is disposed in the substrate at two sides of the gate structure. The dislocation is located in the source/drain region, and is asymmetrical relating to a middle axis of the source/drain region.

19 Claims, 6 Drawing Sheets

(56) References Cited

U.S. PATENT DOCUMENTS

| | | |
|---|---|---|
| 2013/0200455 A1 | 8/2013 | Lo |
| 2013/0228862 A1* | 9/2013 | Lee ................. H01L 21/823807 |
| | | 257/347 |
| 2013/0234203 A1 | 9/2013 | Tsai |
| 2013/0309829 A1 | 11/2013 | Fang |
| 2013/0323893 A1 | 12/2013 | Chuang |
| 2013/0328162 A1* | 12/2013 | Hu ...................... H01L 27/0629 |
| | | 257/526 |
| 2014/0008736 A1 | 1/2014 | Li |
| 2014/0035059 A1 | 2/2014 | Giles |
| 2014/0048886 A1 | 2/2014 | Chuang |
| 2014/0120678 A1 | 5/2014 | Shinriki |
| 2014/0131812 A1* | 5/2014 | Wu ................. H01L 21/823418 |
| | | 257/401 |
| 2014/0167120 A1* | 6/2014 | Chi .................... H01L 27/0886 |
| | | 257/288 |
| 2014/0197493 A1 | 7/2014 | Tsai |
| 2014/0198825 A1 | 7/2014 | Tsai |
| 2014/0374831 A1* | 12/2014 | Liaw ................... H01L 27/1104 |
| | | 257/368 |

* cited by examiner ns, or circuits. The substrate 300 is preferably composed
SEMICONDUCTOR STRUCTURE

BACKGROUND OF THE INVENTION

1. Field of the Invention

The present invention is related to a semiconductor structure, and more particularly, to a semiconductor structure with asymmetrical dislocation.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the Fin-FETS is still aiming to devices with smaller scales.

SUMMARY OF THE INVENTION

For achieving a device with better electrical performance, the present invention therefore provides a semiconductor structure which is applicable both to non-planar or planar transistors.

According to one embodiment, a semiconductor structure is provided, comprising a substrate, a gate structure, a source/drain region and at least a dislocation. The gate structure is disposed on the substrate. The source/drain region is disposed in the substrate at two sides of the gate structure. The dislocation is located in the source/drain region, and is asymmetrical relating to a middle axis of the source/drain region.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
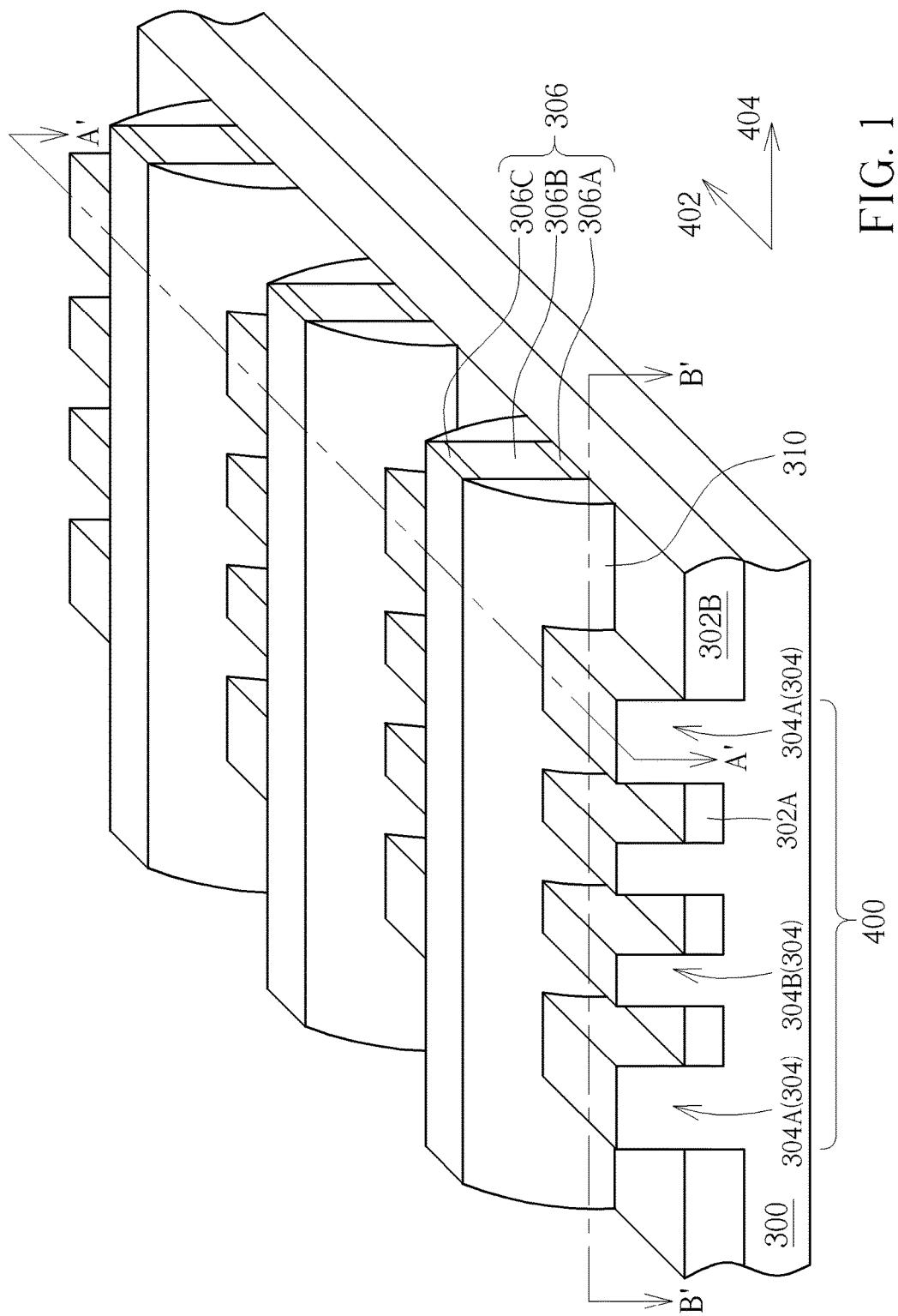
FIG. 1, FIG. 2, FIG. 3, FIG. 4A, FIG. 4B, FIG. 5A, FIG. 5B, FIG. 6A, FIG. 6B and FIG. 7 show schematic diagrams of the method for forming the semiconductor structure according to one embodiment of the present invention.

Please see FIG. 1, FIG. 2, FIG. 3, FIG. 4A, FIG. 4B, FIG. 5A, FIG. 5B, FIG. 6A, FIG. 6B and FIG. 7, showing schematic diagrams of the method for forming the semiconductor structure according to one embodiment of the present invention, wherein FIG. 1 is a three-dimensional view and FIG. 2, FIG. 3, FIG. 4A, FIG. 5A, FIG. 6A and FIG. 7 are cross-sectional view taken along line AA' of FIG. 1, and FIG. 4B, FIG. 5B and FIG. 6B are cross-sectional view taken along line BB' of FIG. 1.

Please see FIG. 1. A semiconductor substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. A region 400 is defined on the substrate 300 wherein a plurality of fin structures 304, a plurality of first shallow trench isolations (STI) 302A and a plurality of gate structures 306 are disposed therein. In one embodiment, the region 400 is encompassed by a second STI 302B, and a depth of the second STI 302B is greater than those of the first STIs 302A. In another embodiment, the depths thereof can be the same. In one preferred embodiment, the region 400 is a dense region so a density of the fin structures 304 is relatively high. Preferably, the fin structures 304 have a critical dimension (CD) based on the manufacturing system.

As shown in FIG. 1, the fin structures 304 generally extend along a first direction 402, and are arranged with the first STIs 302A alternatively. The embodiment in FIG. 1 shows four fin structures 304 for example, but it is understood that the number thereof can be greater or less than four. In one preferred embodiment, the two fin structures 304 closest to the edge of the region 400 have greater width than those of other fin structures 304 in the middle of the region 400, for example, 1.5 to 3 times greater than others. The method for forming the fin structure 304 includes, for example, forming a patterned hard mask layer (not shown) on the substrate 300, performing an etching process to form a plurality of trenches (not shown) in the substrate 300, filling an insulating material such as $SiO_2$ into the trenches, and performing a planarization and/or etching process to form said first STIs 302A. As a result, the protruding portion of the substrate 300 above STI 302 becomes the fin structures 304.

Subsequently, a plurality of gate structures 306 are formed on the substrate 300. The gate structures 306 generally extend along a second direction 404 which is substantially perpendicular to the first direction 402. In one embodiment, the gate structure 306 includes (from bottom to top) a gate dielectric layer 306A, a conductive layer 306B and a capping layer 306C. In one embodiment, the gate dielectric layer 306A, includes $SiO_2$ or high-k dielectric materials, such as a material having dielectric constant greater than 4. The conductive layer 306B can include metal or polysilicon. The capping layer 306C includes, for example, silicon nitride (SiN), silicon carbide (SiC) or silicon oxynitride (SiON). In one embodiment, the capping layer 306C may be one or multi layers composed of different dielectric materials. For example, the capping layer 306C may comprise a first capping layer (not shown) and a second capping layer (not shown), which is composed of $SiO_2$ and SiN, respectively. A spacer 310 may be formed on at least a sidewall of the gate structure 306. The spacer 310 can be a single layer or a composite layer, which is composed of high temperature oxide (HTO), silicon nitride, silicon oxide or silicon nitride (HCD-SiN) formed by hexachlorodisilane, $Si_2Cl_6$).

Figure 2:
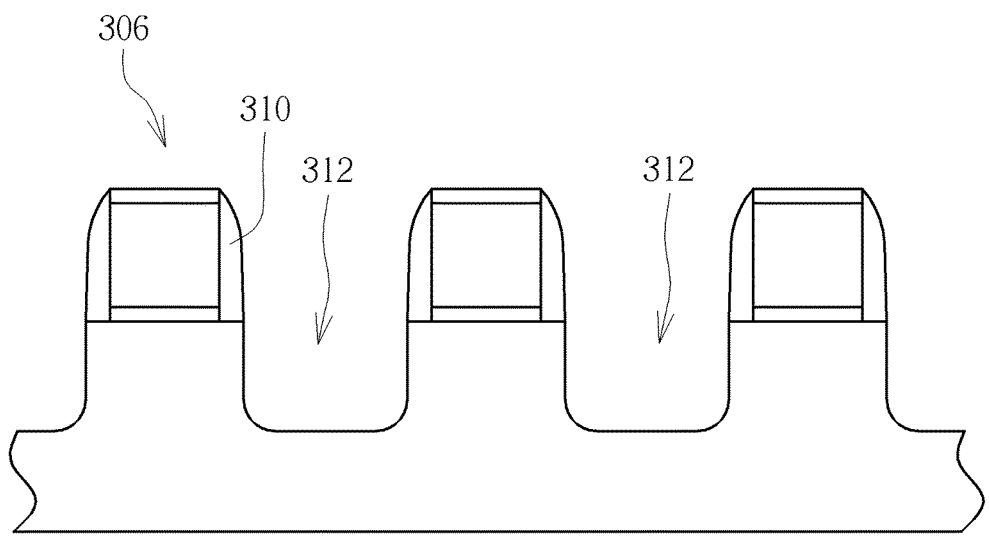

As shown in the cross-sectional view of FIG. 2, one or more than one etching process is performed to form at least one recess 312 in the fin structure 304 (or the substrate 300) at least one side of the gate structure 306. In one preferred embodiment of the present invention, the recess 312 has a curved cross section. The curved recess 312 is formed, for instance, by one or more than one dry etching process, wherein the bias power of the later etching processes are gradually changed until the curved recess 312 is formed. Preferably, the recess 312 does not have a diamond or hexagonal shape in cross-section, which is formed by conventional wet etch process, but is not limited thereto. After the recess 312 is formed, a pre-clean process is selectively conducted by using cleaning agent such as diluted hydrofluoric acid (HF) or Piranha solution (also called "SPM") that contains sulfuric acid ($H_2SO_4$), hydrogen peroxide ($H_2O_2$), and deionized water to remove native oxide or other impurities from the surface of the recess 312.

Figure 3:
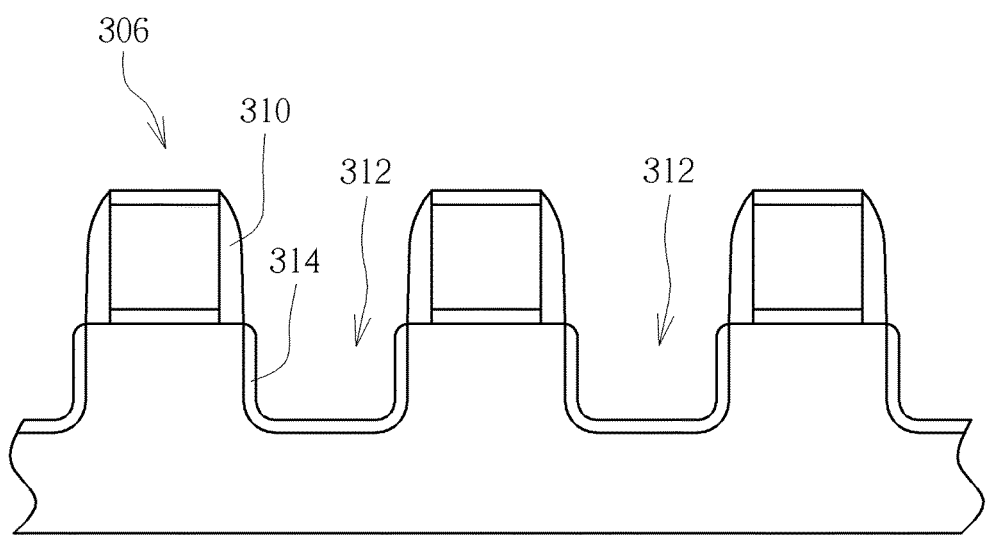

As shown in FIG. 3, a buffer layer 314 is formed in the recess 312, covering a surface of the fin structure 304 (or the substrate 300) in the recess 312. In one embodiment, the buffer layer 314 is formed conformally along the surface of the recess 312 by a selective epitaxial growth (SEG) process such that the buffer layer 314 may also have a curved cross section as the recess 312, and also have a uniform thickness. In one embodiment, when the subsequently formed transistor is an N type transistor, the material of the buffer layer 314 may include silicide phosphorus (SiP) or silicon carbon (SiC), where a concentration of phosphorus or carbon is greater than $1*10^{-21}$ atom/$cm^2$; while the subsequently formed transistor is a P type transistor, the material of the buffer layer 314 may include silicide germanium (SiGe).

Figure 4A:
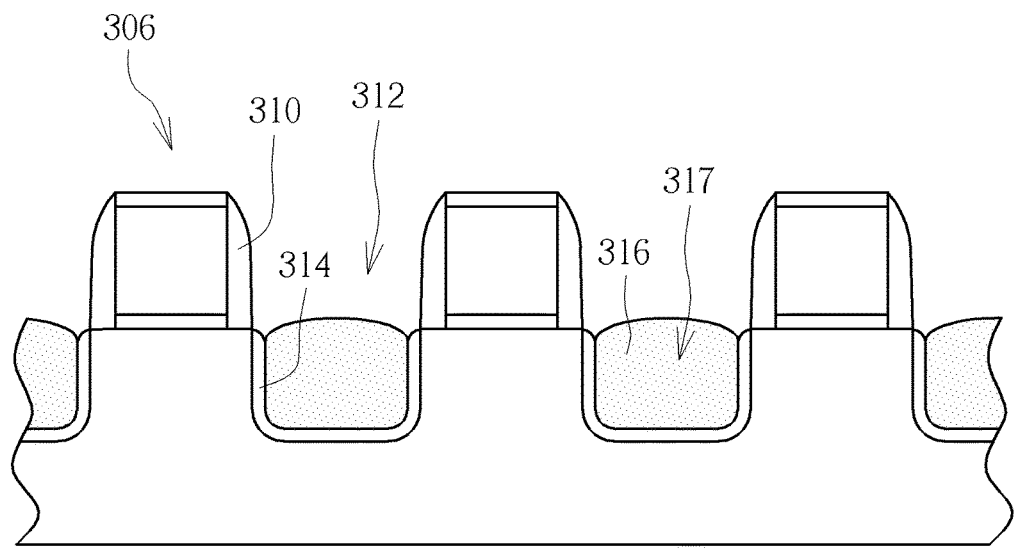
Figure 4B:
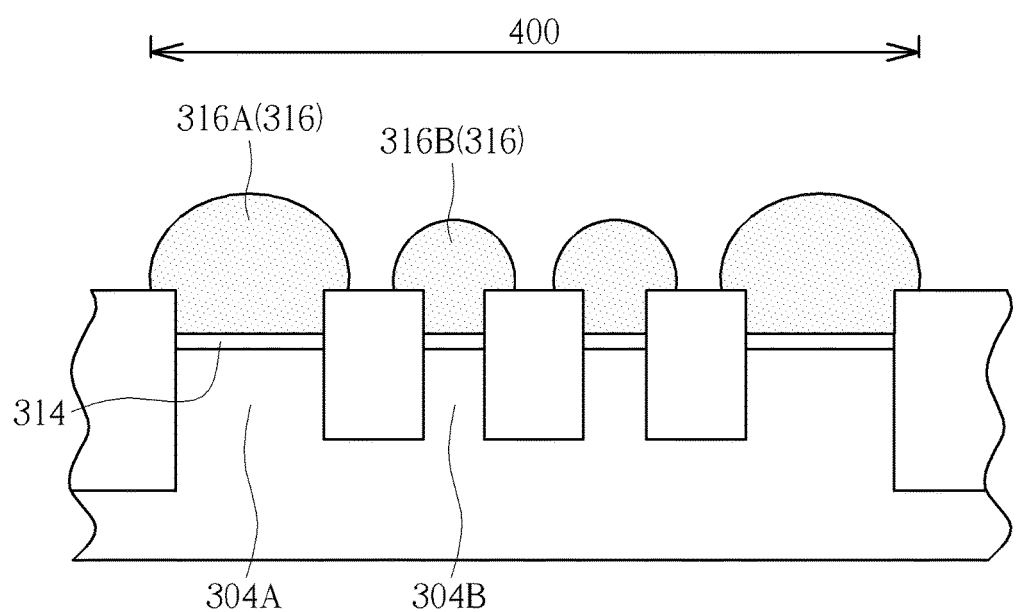
Figure 5A:
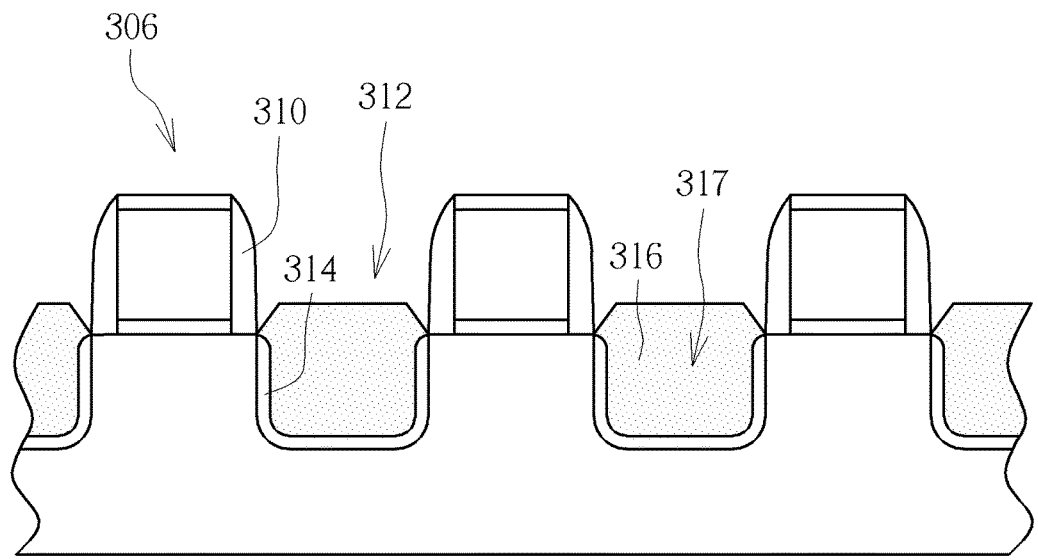
Figure 5B:
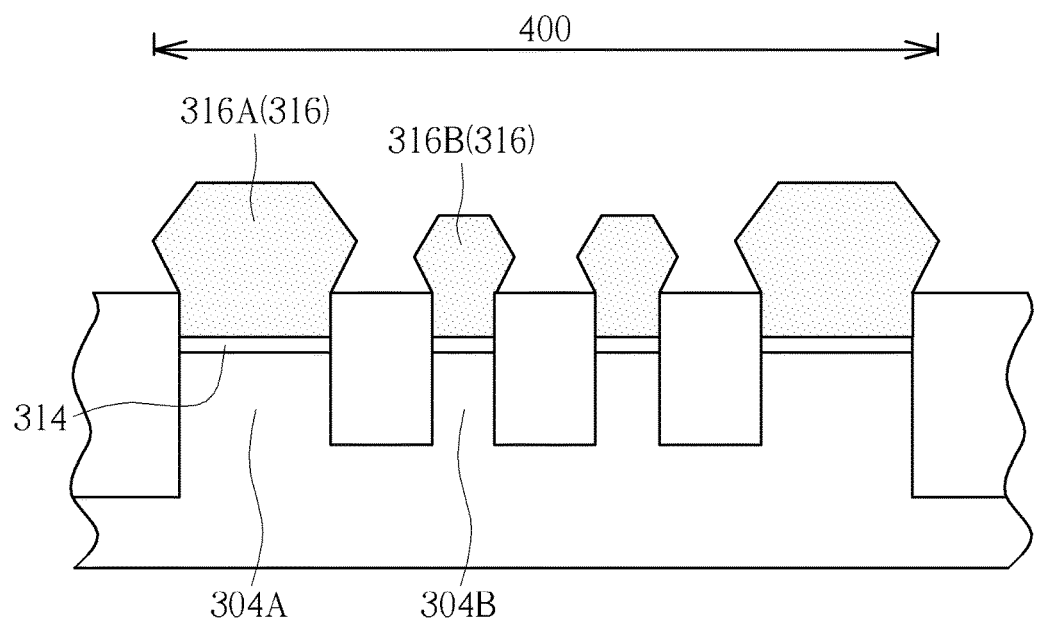

Please next refer to FIG. 4A and FIG. 4B wherein FIG. 4A is cross sectional view taken along line AA' of FIG. 1 and FIG. 4B is cross sectional view taken along line BB' of FIG. 1. Please see FIG. 4A first. An SEG process is performed to form an epitaxial layer 316 on the buffer layer 314. In one embodiment, the epitaxial layer 316 completely fills the recess 312, and slightly protrudes from the recess 312. Alternatively, a top surface of the epitaxial layer 316 can be located at an opening of the recess 312 and leveled with a top of fin structure 304. In one embodiment, a concentration of germanium (P-type transistor) or the carbon/phosphorus (N-type transistor) in the epitaxial layer 316 is greater than a concentration of germanium (P-type transistor) or carbon/phosphorus (N-type transistor) in the buffer layer 314. In another embodiment, they can be the same. Subsequently, an ion implantation process is conducted and a dopant is formed in all or a part of the epitaxial layer 316, thereby forming a source/drain region 317. In one embodiment, when the subsequently formed transistor is a P-type transistor, the dopant is P type dopant, such as boron (B) and/or boron fluoride (BF). Conversely, if the transistor is an N-type transistor, the first conductivity type dopant an N-type dopant such as arsenic (As) and/or phosphorus (P) and/or antimony (Sb), but are not limited thereto. In one embodiment, the process of the implantation process for forming the source/drain region 317 may include a pre-amorphous implantation (PAI) process to amorphize a part or all of the epitaxial layer 316. In another embodiment, the dopant can be implanted into the epitaxial layer 316 in-situ along with the SEG process, so as to form the epitaxial layer 316 and the source/drain region 317 simultaneously. In this embodiment, a PAI should be performed additionally to implant dopant such as As or Ge into the epitaxial layer 316 to amorphize a part of all of the epitaxial layer 316. It is noted that, the implantation process for forming the source\drain region 317 or the PAI process preferably not function upon the buffer layer 314. In addition, as shown in FIG. 4B, since the fin structures 304A closest to the edge of the region 400 have larger width, the epitaxial layer 316A formed on said fin structures 304A have larger size, while the other epitaxial layer 316B formed the fin structures 304B have smaller size. In another embodiment, please see FIG. 5A and FIG. 5B wherein FIG. 5A is cross sectional view taken along line AA' of FIG. 1 and FIG. 5B is cross sectional view taken along line BB' of FIG. 1. As shown, the epitaxial layer 316 can have a non-curved top surface. For example, the top surface of the epitaxial layer 316 can have one or more than one corners, thereby forming a hexagonal shape protruding over the fin structure 304 in its cross-section. However, the epitaxial layer 316 can have other shape depending on different product design. The following context will be based on the embodiments in FIG. 4A and FIG. 4B for example.

Figure 6A:
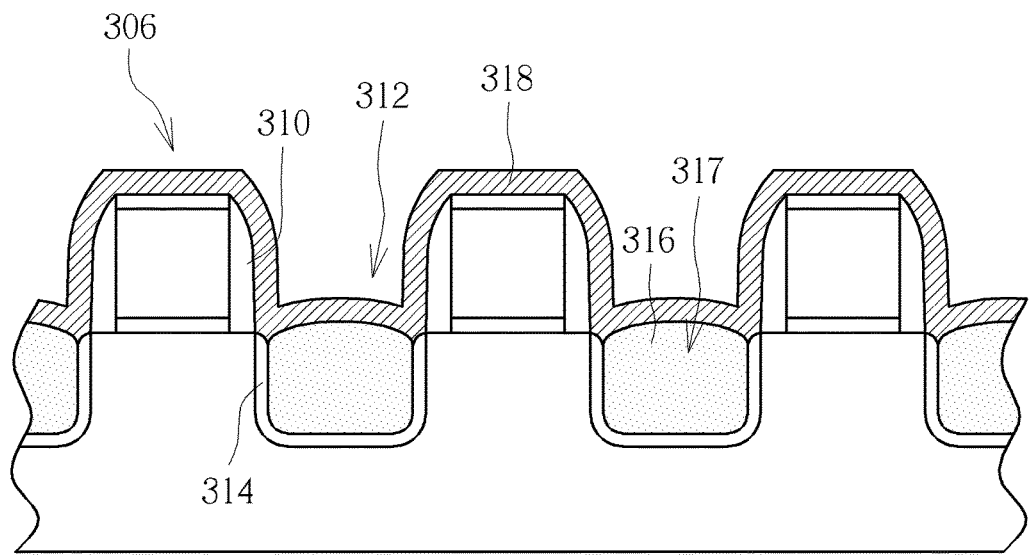
Figure 6B:
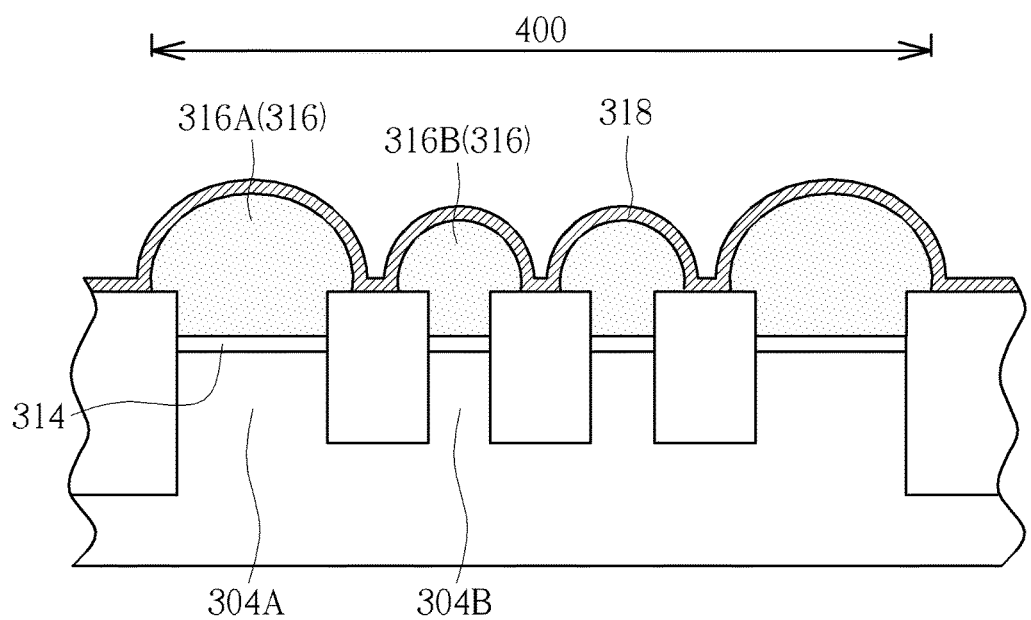

Please next refer to FIG. 6A and FIG. 6B wherein FIG. 6A is cross sectional view taken along line AA' of FIG. 1 and FIG. 6B is cross sectional view taken along line BB' of FIG. 1. As shown in FIG. 6A, a contact etch stop layer (CESL) 318 is formed comprehensively on the substrate 300 for covering the epitaxial layer 316, the spacer 310 and the gate structure 306. In the present invention, the CESL 318 has a stress to provide a selective strain scheme (SSS). In one embodiment, if the subsequently formed transistor is an N-type transistor, the CESL 318 is preferably a tensile stress; if the transistor is a P-type transistor, the stress is a compressive stress, but can be adjusted depending on the design and is not limited thereto.

Figure 7:
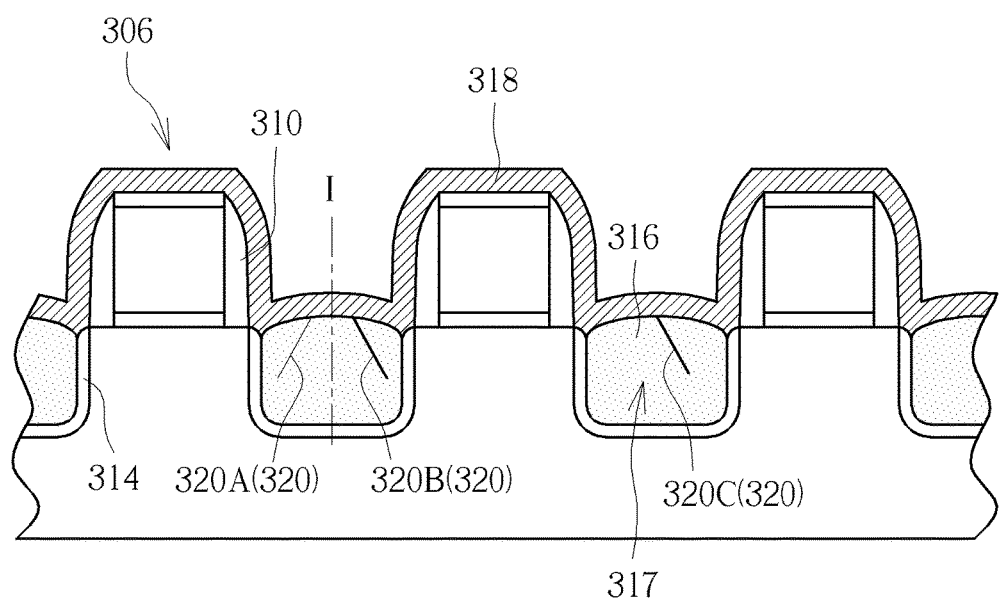

Next, as shown in FIG. 7, an annealing process is carried out to re-crystallization the epitaxial layer 316. In one embodiment, the annealing process is carried out at 400 degrees to 700 degrees Celsius for example. After the annealing process, a plurality of dislocations 320 are formed in the epitaxial layer 316, wherein the dislocations 320 in one epitaxial layer 316 (or the source/drain region 317) are asymmetrically relating to a middle axis I of the epitaxial layer 316 (or the source/drain region 317). In one embodiment shown in FIG. 7, taking the dislocations 320 in the left-most epitaxial layer 316 for example, the right dislocation 320B (which is far from the edge of the region 400) is more severe. In other words, the right dislocation is thicker while the left dislocation is thinner. In another embodiment, the right dislocation extends a greater distance than the left one. In still another embodiment, taking the right epitaxial layer 316 for example, there is no dislocation at the left side while there is a dislocation 320C at the right side, still arranging in a asymmetrical manner. Besides, in one embodiment, the asymmetrical dislocations 320 does not extend or penetrate through the buffer layer 316. The dislocations 320 can be formed both in N transistors or P transistors.

It is worth noting that the foregoing embodiments show non-planar transistor, but to those skilled in the art, it should be understood that the present invention is also applicable to planar transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a plurality of gate structures disposed on a substrate;
a plurality of source/drain regions disposed in the substrate at two sides of the plurality of gate structures; and
a plurality of dislocations disposed in one of the plurality of source/drain regions which is between and directly adjacent to two of the plurality of gate structures, and wherein the plurality of dislocations are asymmetrical to each other relating to a vertical middle axis of the one of the plurality of source/drain regions where the plurality of dislocations are disposed.

2. The semiconductor structure according to claim 1, wherein one of the plurality of dislocations is more severe than another one of the plurality of dislocations.

3. The semiconductor structure according to claim 1, wherein one of the plurality of dislocations extends a larger distance than another one of the plurality of dislocations does.

4. The semiconductor structure according to claim 1, further comprising a plurality of fin structures disposed on the substrate, wherein the plurality of source/drain regions are located in one of the plurality of fin structures.

5. The semiconductor structure according to claim 4, wherein a region is defined on the substrate, and two of the plurality of fin structures closest to an edge of the region have a greater width than those of other fin structures.

6. The semiconductor structure according to claim 5, wherein one of the plurality of dislocations far from the edge of region is more severe than another one of the plurality of dislocations near the edge of the region.

7. The semiconductor structure according to claim 5, further comprising a plurality of first shallow trench isolations arranged alternatively with the plurality of fin structures.

8. The semiconductor structure according to claim 7, wherein the region is encompassed by a second shallow trench isolation, and a depth of the second shallow trench isolation is greater than depths of the plurality of first shallow trench isolations.

9. The semiconductor structure according to claim 5, further comprising a plurality of epitaxial layers disposed in one of the plurality of fin structures where the plurality of source/drain regions are disposed, wherein each of the plurality of source/drain regions is disposed in each of the plurality of epitaxial layers.

10. The semiconductor structure according to claim 9, wherein two epitaxial layers in the plurality of fin structures closest to the edge of the region have larger size than the plurality of epitaxial layers in other fin structures.

11. The semiconductor structure according to claim 9, further comprising a buffer layer disposed between the plurality of epitaxial layers and the plurality of fin structures.

12. The semiconductor structure according to claim 11, wherein the buffer layer has a substantially curved shape in its cross-section.

13. The semiconductor structure according to claim 12, wherein the buffer layer has a uniform thickness.

14. The semiconductor structure according to claim 12, wherein the buffer layer directly surrounds and contacts the plurality of epitaxial layers and is conformally with an edge of the epitaxial layer.

15. The semiconductor structure according to claim 12, wherein the plurality of dislocations do not penetrate through the buffer layer.

16. The semiconductor structure according to claim 1, wherein one of the plurality of source/drain regions comprises a P-type dopant.

17. The semiconductor structure according to claim 1, wherein the plurality of dislocations in one source/drain region at one side of one of the plurality of gate structures is asymmetrical to the plurality of dislocations in one source/drain region at other side of the gate structure relating to an axis of the gate structure.

18. The semiconductor structure according to claim 1, further comprising:
a plurality of fin structures disposed on the substrate, wherein the plurality of source/drain regions are located in one of the plurality of fin structures at two sides of the gate structure;
a plurality of epitaxial layers disposed in one of the plurality of fin structures, wherein each source/drain region is disposed in each epitaxial layer; and
a buffer layer disposed between and directly contacts bottom surface and sidewalls of each epitaxial layer and each fin structure, wherein the plurality of dislocations does not penetrate into the buffer layer.

19. A semiconductor structure, comprising:
a plurality of gate structures disposed on a substrate;
a plurality of source/drain regions disposed in the substrate at two sides of the plurality of gate structures; and
a plurality of dislocations completely disposed in one of the plurality of source/drain regions which is between two of the plurality of gate structures, and wherein the plurality of dislocations are asymmetrical to each other relating to a vertical middle axis of the one of the plurality of source/drain regions where the plurality of dislocations are disposed.

* * * * *